United States Patent [19]
Sellers

[11] Patent Number: 5,407,866
[45] Date of Patent: Apr. 18, 1995

[54] METHOD FOR FORMING A DIELECTRIC LAYER ON A HIGH TEMPERATURE METAL LAYER

[75] Inventor: James A. Sellers, Tempe, Ariz.

[73] Assignee: Motorola, Inc., Schaumburg, Ill.

[21] Appl. No.: 190,392

[22] Filed: Feb. 2, 1994

[51] Int. Cl.[6] .......................................... H01L 21/302
[52] U.S. Cl. ..................................... 437/225; 437/43; 437/192; 437/195; 437/228
[58] Field of Search ............... 473/192, 228, 229, 195, 473/43, 225

[56] References Cited

U.S. PATENT DOCUMENTS

| | | | |
|---|---|---|---|
| 4,775,550 | 10/1988 | Chu et al. | 437/235 |
| 5,043,300 | 8/1991 | Nulman | 437/192 |
| 5,093,710 | 3/1992 | Higuchi | 437/195 |
| 5,162,362 | 11/1992 | Ajika et al. | 437/192 |
| 5,175,126 | 12/1992 | Ho et al. | 437/192 |
| 5,215,933 | 6/1993 | Araki | 437/43 |
| 5,229,311 | 7/1993 | Lai et al. | 437/43 |
| 5,240,880 | 8/1993 | Hindman et al | 437/192 |

OTHER PUBLICATIONS

Thomas E. Tang et al., "Titanium Nitride Local Interconnect Technology for VLSI," IEEE Transactions on Electron Devices, vol. ED-34, No. 3, Mar. 1987, pp. 682-688.

Stanley Wolf, Ph.D. and Richard N. Tauber, Ph.D., Silicon Processing For The VLSI Era, vol. 1: Process Technology, Lattice Press, Sunset Beach, California, 1986, pp. 384-387.

*Primary Examiner*—R. Bruce Breneman
*Assistant Examiner*—Ramamohan Rao Paladugu
*Attorney, Agent, or Firm*—Kevin B. Jackson

[57] ABSTRACT

A method for forming a dielectric layer (16) on a high temperature metal layer (14) is provided. By processing the high temperature metal layer (14) with a non-oxidizing photoresist stripper and absent a photoresist hardening step, adhesion between the high temperature metal layer (14) and a dielectric layer (16) subsequently formed on the high temperature metal layer (14) is significantly improved. The dielectric layer (16) will adhere to the high temperature metal layer (14) in high temperature environments. The method is suitable for forming multi-layer metallization and buried layer structures for semiconductor integrated circuits.

18 Claims, 2 Drawing Sheets

METHOD FOR FORMING A DIELECTRIC LAYER ON A HIGH TEMPERATURE METAL LAYER

BACKGROUND OF THE INVENTION

This invention relates, in general, to a method for forming a passivation layer on a conductive layer, and more particularly, to a method for forming a dielectric layer on a high temperature metal layer.

Integrated circuit contacts and interconnects often comprise, among other things, heavily doped polysilicon. However, because the sheet resistance of heavily doped polysilicon films is on the order of 20 ohms/square, these films cause long RC time constants and hence, undesirable time delays. This undesirable time delay negatively impacts the ability to fabricate dense, high performance semiconductor devices. As a result, several methods have been used to improve the sheet resistance of semiconductor interconnects.

One method is the polycide method where a metal silicide is formed over a doped polysilicon layer. This method has a disadvantage in that it requires depositing and patterning two films. Also, when the metal silicide layer is formed over the polysilicon, the silicide formation tends to deplete dopants in the polysilicon layer thus increasing the sheet resistance of the polysilicon layer.

It would be desirable to use a high temperature metal layer, such as titanium, vanadium, chromium, tantalum, or their nitrides, as a buried layer or as an interconnect because only one film would have to be deposited and patterned. In addition, the high temperature metal layer would provide a low sheet resistance and would not be susceptible to the dopant depletion problem found in the polycide process. However, when a patterned high temperature metal layer is used, for example, as a buried interconnect with a dielectric layer formed over the high temperature metal layer, delamination occurs between the metal layer and the dielectric layer. This is particularly true if the layers are subsequently exposed to high temperatures. This delamination problem can result in electronic component reliability problems.

Thus, there exists a need for a method for forming a dielectric layer on a high temperature metal that provides good adhesion between the dielectric layer and the high temperature metal layer.

SUMMARY OF THE INVENTION

Briefly stated, a method for forming a dielectric layer on a high temperature metal layer is provided. A patterned high temperature metal layer is formed on a first surface of a substrate. The photoresist used to pattern the high temperature metal layer is removed using a non-oxidizing wet photoresist stripper. A dielectric layer is then formed over the high temperature metal layer.

DETAILED DESCRIPTION OF THE DRAWINGS

Figure 1:
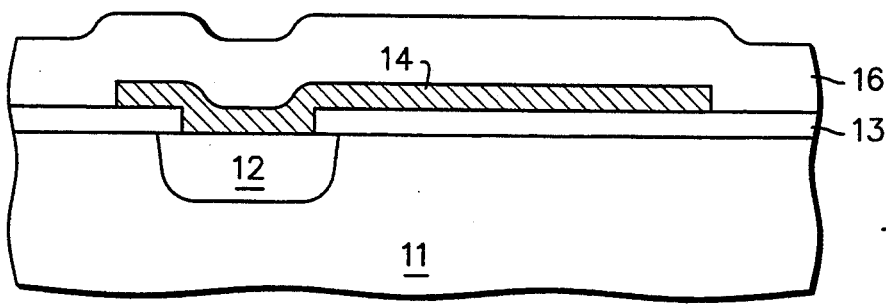
FIG. 1 illustrates an enlarged, cross-sectional view of an embodiment according to the present invention.

Generally, the present invention provides a method for forming a dielectric layer on a high temperature metal layer. The present invention can be more fully described with reference to FIGS. 1 through 9. As an example of an embodiment of the present invention, FIG. 1 shows an enlarged cross-sectional view of a substrate 11 having doped region 12, and dielectric layer 13 formed on a surface of substrate 11. Typically, substrate 11 comprises a semiconductor material. Doped region 12 may be the same or an opposite conductivity type compared to substrate 11.

When formed with other doped regions, doped region 12 forms a source or a drain of a field effect transistor, or a collector, a base, or an emitter of a bipolar transistor for example. High temperature metal layer 14 is formed over dielectric layer 13 and makes contact to doped region 12. Optionally, high temperature metal layer 14 makes complete contact to substrate 11 absent dielectric layer 13 to form a buried layer for example. Preferably, high temperature metal layer 14 comprises titanium, titanium-nitride, vanadium, vanadium-nitride, chromium, chromium-nitride, tantalum, or tantalum-nitride. These high temperature metals are preferred because they have sheet resistance values on the order of less than 10 ohms/square. In addition, they possess favorable free energies of oxide formation and thus form good bonds to dielectrics such as silicon oxides. However, to form a good bond between high temperature metal layer 14 and a dielectric, high temperature metal layer 14 must be processed properly. The present invention provides such a process. In the most preferred embodiment, high temperature metal layer 14 comprises titanium-nitride. Dielectric layer 16 is formed over high temperature metal layer 14 to provide passivation for a multi-level metallization scheme for example.

Experimentation showed that in order to provide good adhesion between high temperature metal layer 14 and dielectric layer 16, high temperature metal layer 14 must be processed in a non-oxidizing environment prior to the deposition of dielectric layer 16. It was found that surface oxidation, among other things, of high temperature metal layer 14 prior to the deposition of dielectric layer 16 greatly reduces the adhesion between the two layers, particularly when high temperature metal layer 14 and dielectric layer 16 are subsequently exposed to temperatures above 800° C.

Figure 2:
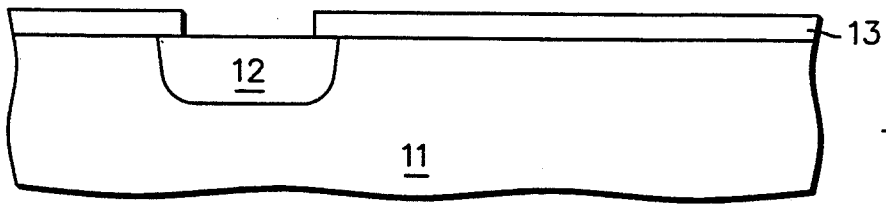
FIGS. 2-7 illustrate enlarged, cross-sectional views of the embodiment of FIG. 1 according to the present invention at various stages of fabrication.
Figure 3:
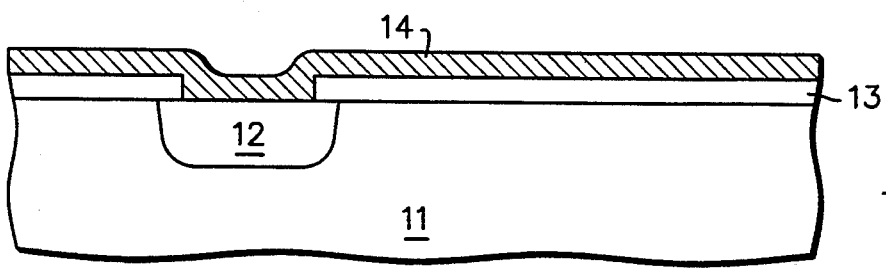

As an example of a method for processing high temperature metal layer 14 in a non-oxidizing environment prior to deposition of dielectric layer 16, FIG. 2 shows substrate 11 at an earlier stage of fabrication. An opening 19 is formed in dielectric layer 13 to provide contact to doped region 12. Next, as shown in FIG. 3, high temperature metal layer 14 is formed over dielectric layer 13 and substrate 11, to make contact to doped region 12. Methods for forming high temperature metal layer 14 are well known in the art using techniques such as sputtering, reactive evaporation, and chemical vapor deposition.

In the most preferred embodiment, high temperature metal layer 14 comprises titanium-nitride and preferably is formed using a reactive ion sputter deposition where a pure titanium metal target is sputtered in the presence of nitrogen. Titanium-nitride is preferred because titanium-nitride films have sheet resistance values on the order of 5 ohms/square, they are stable at high temperature, they provide a good diffusion barrier, they have low stress, and they have a high resistance to etch related undercutting and corrosion.

Figure 4:
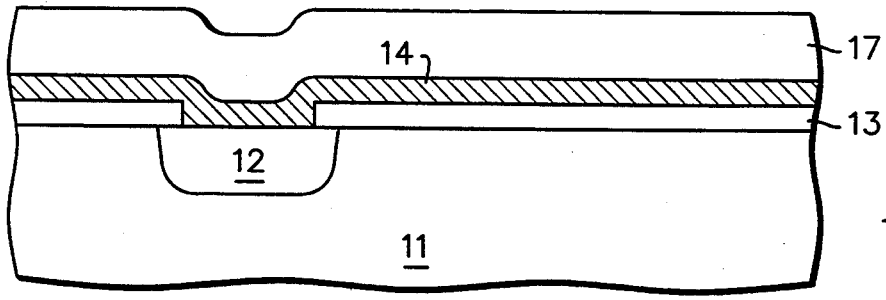

FIG. 4 shows substrate 11 at a further stage in fabrication. Photoresist layer 17 is deposited onto high temperature metal layer 14. Photoresist layer 17 comprises either a negative resist or a positive photoresist. Photoresist layer 17 is preferably a positive resist such as JRS IX 500 EL 30 CD resist for example, available from Japan Synthetic Rubber Co. After photoresist layer 17 is deposited, photoresist layer 17 is soft baked at a low temperature to dehydrate and remove excess solvents. Next, photoresist layer 17 is selectively exposed to light using a photomask.

Figure 5:
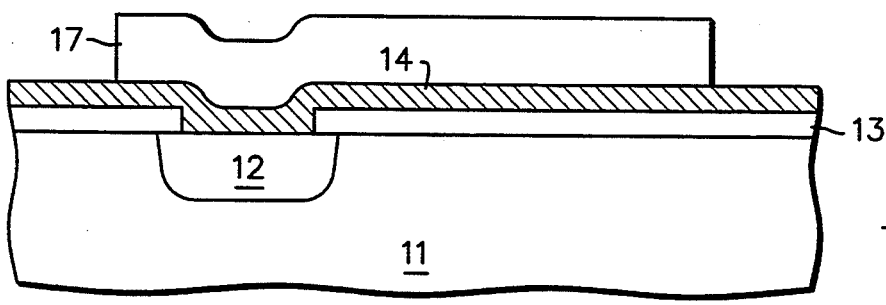

As shown in FIG. 5, after exposure, photoresist layer 17 is developed to selectively remove photoresist layer 17 to form a desired pattern. To develop positive photoresist, a pH basic non-metal ion containing developer such as tetra-methyl ammonium hydroxide is used. Such a developer is MFCD-26, which is available from Shipley. After development, photoresist layer 17 preferably is not subjected to a hardening process, such as a deep UV radiation or a low energy inert gas plasma, to prevent excessive hardening of the photoresist. Experimentation showed that a photoresist hardening process results in residual photoresist remaining on high temperature metal layer 14, particularly around the periphery of substrate 11, after removing the remaining photoresist layer 17. This is particularly true when a wet photoresist stripper is used as opposed to a dry photoresist stripper. It was found that this residual photoresist on the surface of high temperature metal layer 14 contributes to adhesion problems between high temperature metal layer 14 and dielectric layer 16.

Figure 6:
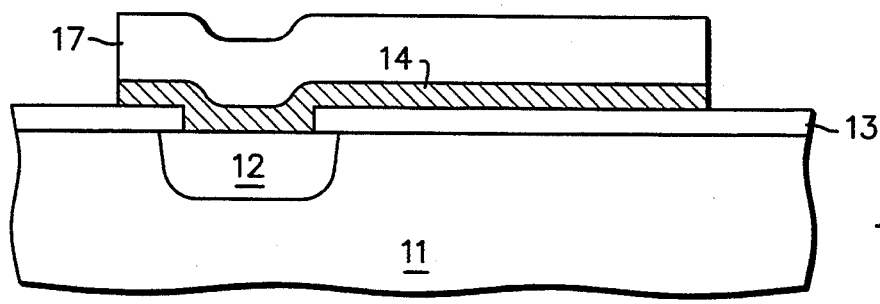

Next, as shown in FIG. 6, high temperature metal layer 14 is etched to conform to the pattern provided by remaining photoresist layer 17. High temperature metal layer 14 is etched using a reactive ion etch system with a chlorine based chemistry for example. In certain applications, it is preferred not to use BCl3 based chemistry to etch high temperature metal layer 14 because residual BCl3 may remain on etched surfaces not protected by photoresist layer 17. The residual BCl3 provides a potential dopant source for boron to diffuse into substrate 11 during subsequent high temperature processing thus forming unwanted p-type regions.

Figure 7:
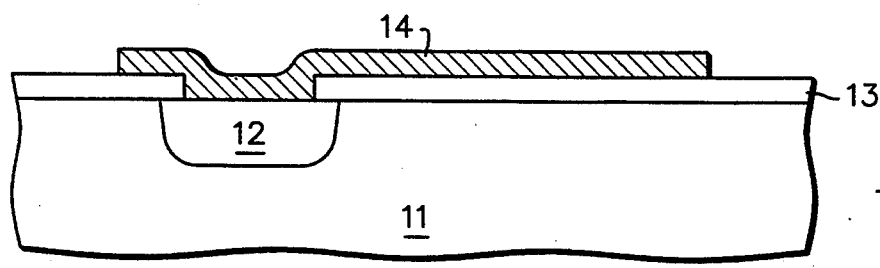

As shown in FIG. 7, after high temperature metal layer 14 is etched, the remaining photoresist layer 17 is removed using a non-oxidizing wet photoresist stripper. When photoresist layer 17 comprises a positive photoresist, a non-oxidizing wet photoresist stripper comprising n-methyl pyrrolidone (NMP) having a basic pH is used. An example of such a stripper is Posistrip ™, which is available from EKC Technologies of Hayward, Calif. When photoresist layer 17 comprises a negative photoresist, a non-oxidizing wet photoresist stripper comprising a heavy aromatic organic solvent with a sulfonic acid derivative is used. An example of such a stripper is NS-12, which is available from Advanced Chemical Technologies Inc. of Allentown, Pa.

To prevent surface oxidation of high temperature metal layer 14 and subsequent adhesion problems, remaining photoresist layer 17 is not removed using a dry oxidation based photoresist removal method such as oxygen plasma. Experimentation showed that if any dry oxidation based photoresist removal methods are used to remove photoresist layers formed over high temperature metal layer 14, adhesion problems resulted between high temperature metal layer 14 and a dielectric layer formed subsequently on high temperature metal layer 14. Surface oxidation of high temperature metal layer 14, which results from dry oxidation based photoresist removal methods was found to be a significant contributor to adhesion problems. Also, if photoresist or etch reworking of high temperature metal layer 14 is required, the wet photoresist stripper must be used to prevent subsequent adhesion problems.

In a preferred embodiment, to remove photoresist layer 17, two baths containing the NMP are used in a serial manner. The first bath is preferably recirculated and filtered and is maintained at approximately 75° to 85° C. Substrate 11 having photoresist layer 17 is exposed to NMP in the first bath for approximately 15 minutes. The second bath is preferably maintained at approximately 45° to 55° C. and serves to remove any residual photoresist layer 17. Substrate 11 is exposed to NMP in the second bath for approximately 5 minutes. Following the second NMP bath, substrate 11 is rinsed using de-ionized water and dried using conventional rinser/dryer technology.

Referring back to FIG. 1, after photoresist layer 17 is removed, dielectric layer 16 is formed on high temperature metal layer 14. Dielectric layer 16 may be silicon oxide, silicon nitride, silicon oxynitride, PSG, or BPSG. In a preferred embodiment, dielectric layer 16 is silicon oxide deposited using plasma-enhanced (PE) chemical vapor deposition from tetraethylorthosilicate (TEOS), commonly referred to as plasma-enhanced tetraethylorthosilicate (PETEOS). Preferably, dielectric layer 16 is deposited at approximately 400° C. with a growth rate of approximately 125 to 145 angstroms/second.

Figure 8:
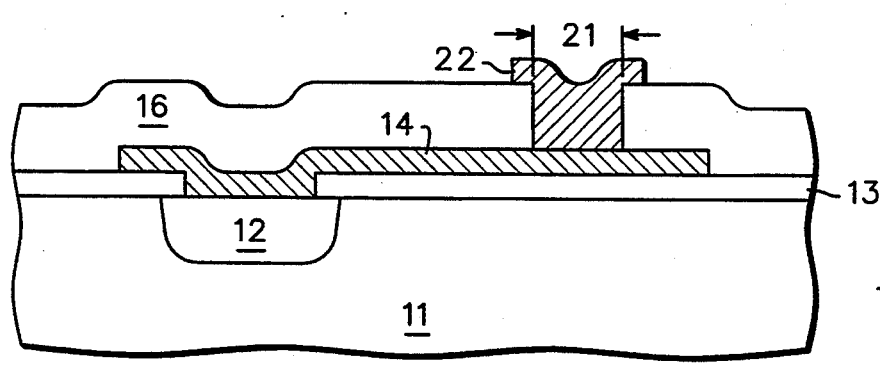
FIG. 8 illustrates an enlarged, cross-sectional view of the embodiment of FIG. 1 according to the present invention at a further stage of fabrication.

Dielectric layer 16 may be patterned or unpatterned. As shown in FIG. 8, layer 16 may be patterned to form an opening 21 to provide contact between high temperature metal layer 14 and metallization contact 22. Multiple layers of metal and dielectric may be formed using the above process. Optionally, dielectric layer 16 is annealed after deposition to reduce stresses in dielectric layer 16, particularly stresses localized over the edges of patterned high temperature layer 14. Preferably, when dielectric layer 16 comprises PETEOS, it is annealed in an inert gas such as nitrogen with an oxygen concentration of less than 3000 ppm at a temperature of approximately 1000° C. for approximately 60 minutes. An inert gas is preferred to prevent oxidation of high temperature metal layer 14 by oxygen diffusion through dielectric layer 16. In addition, the anneal serves to densify and stabilize the PETEOS for further high temperature processing.

Figure 9:
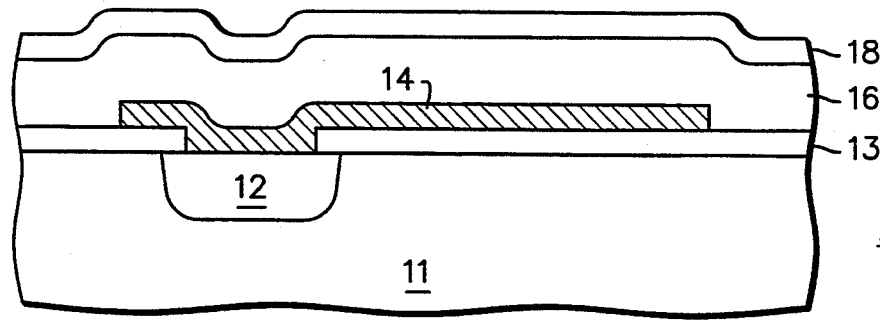
FIG. 9 illustrates an enlarged, cross-sectional view of a second embodiment according to the present invention.

A second embodiment is shown in FIG. 9 where a second dielectric layer 18 is formed over dielectric layer 16 to provide an additional barrier to protect high temperature metal layer 14 from oxidation. Second dielectric layer 18 is preferably an effective barrier against oxidizing species when substrate 11 is exposed to aggressive oxidizing ambients such as high temperature wet oxidation processes after high temperature metal layer 14 and dielectric layer 16 are formed. An example of such a second dielectric layer is silicon nitride.

By now it should be appreciated that there has been provided a method for forming a dielectric layer on a high temperature metal layer. By processing the photoresist layer used to pattern the high temperature metal layer without a photoresist hardening step and by removing the photoresist layer used to pattern the high temperature layer with a non-oxidizing photoresist stripper, adhesion between the high temperature metal layer and a dielectric layer subsequently formed over the high temperature metal layer is significantly improved. The dielectric layer will adhere to the high temperature metal layer even during subsequent high temperature environments.

I claim:

1. A method for forming a dielectric layer on a high temperature metal layer so that the dielectric layer adheres to the high temperature metal layer when exposed to elevated temperature comprising the steps of:
   providing a substrate having a first and second surface;
   forming a high temperature metal layer on the first surface of the substrate, wherein the high temperature metal layer has a favorable free energy of oxide formation;
   depositing a photoresist layer on the high temperature metal layer;
   selectively exposing the photoresist layer to light;
   developing the photoresist layer to selectively remove photoresist to form a pattern in the photoresist layer;
   etching the high temperature metal layer to conform to the pattern in the photoresist layer;
   removing the remaining photoresist layer using a non-oxidizing photoresist stripper;
   forming a dielectric layer on the high temperature metal layer, wherein the dielectric layer adheres to the high temperature metal layer when the substrate is subsequently exposed to elevated temperature; and
   annealing the dielectric in an inert gas to stabilize the dielectric layer for further high temperature processing.

2. The method of claim 1 wherein the step of forming the high temperature metal layer on the first surface of the substrate comprises forming a metal layer wherein the metal layer is selected from the group consisting of titanium, titanium-nitride, vanadium, vanadium-nitride, chromium, chromium-nitride, tantalum, and tantalum-nitride; and wherein the step of forming the dielectric layer comprises depositing a layer of silicon oxide using plasma-enhanced chemical vapor deposition from TEOS.

3. The method of claim 1 wherein the step of developing the photoresist layer comprises developing the photoresist layer absent a photoresist hardening step before the step of etching the high temperature metal.

4. The method of claim 1 wherein the step of depositing the photoresist layer comprises depositing a positive photoresist and the step of removing the photoresist layer using the non-oxidizing photoresist stripper comprises removing the photoresist layer with a stripper comprising n-methyl pyrrolidone having a basic pH.

5. The method of claim 4 wherein the step of removing the photoresist layer comprises the steps of removing the photoresist layer in a first bath of n-methyl pyrrolidone maintained at a temperature of approximately 75° to 85° C. and removing residual photoresist in a second bath of n-methyl pyrrolidone maintained at approximately 45° to 55° C.

6. The method of claim 1 wherein the step of etching the high temperature metal layer comprises etching the high temperature metal layer in a reactive ion etchant consisting essentially of chlorine.

7. The method of claim 1 wherein the step of annealing comprises heating the dielectric layer to approximately 1000° C. in nitrogen.

8. A method for forming a dielectric layer on a high temperature metal layer wherein the dielectric layer adheres to the high temperature metal layer under high temperature conditions-comprising the steps of:
   providing a substrate having a first and second surface;
   forming a high temperature metal layer on the first surface, wherein the high temperature metal is selected from the group consisting of titanium, titanium-nitride, vanadium, vanadium-nitride, chromium, chromium-nitride, tantalum, and tantalum-nitride;
   forming a photoresist layer on the high temperature metal layer;
   selectively exposing the photoresist layer to light;
   developing the photoresist layer to selectively remove photoresist to form a pattern;
   etching the high temperature metal layer to conform to the pattern in the photoresist layer;
   removing the remaining photoresist layer using a non-oxidizing photoresist stripper; and
   depositing a first dielectric layer on the high temperature metal, and wherein the first dielectric layer adheres to the high temperature metal layer during subsequent high temperature environments.

9. The method of claim 8 wherein the step of developing the photoresist layer comprises developing the photoresist layer absent a photoresist hardening step before the step of etching the high temperature metal.

10. The method of claim 8 wherein the step of depositing the photoresist layer comprises depositing a positive photoresist and the step of removing the photoresist layer using the non-oxidizing photoresist stripper comprises removing the photoresist layer with a stripper comprising n-methyl pyrrolidone having a basic pH.

11. The method of claim 10 wherein the step of removing the photoresist layer comprises the steps of removing the photoresist layer in a first bath of n-methyl pyrrolidone maintained at a temperature of approximately 75° to 85° C. and removing residual photoresist in a second bath of n-methyl pyrrolidone maintained at approximately 45° to 55° C.

12. The method of claim 8 wherein the step of depositing a first dielectric layer comprises:
   depositing a silicon oxide layer using a plasma-enhanced source comprising TEOS.

13. The method of claim 8 further comprising the step of annealing the first dielectric layer in an inert ambient at approximately 1000° C.

14. The method of claim 8 further comprising the step of forming a second dielectric layer on the first dielectric layer.

15. The method of claim 14 wherein the step of forming a second dielectric layer comprises depositing a silicon nitride layer.

16. A method for forming a dielectric layer on titanium-nitride wherein the dielectric layer adheres to the titanium-nitride layer under high temperature conditions comprising the steps of:
   providing a semiconductor substrate having a first and a second surface;
   forming a titanium-nitride layer on the first surface;

depositing a photoresist layer on the titanium-nitride layer;

selectively exposing the photoresist layer to light;

developing the photoresist layer to selectively remove photoresist to form a pattern in the photoresist layer, wherein the photoresist layer is developed absent a subsequent photoresist hardening step;

etching the titanium-nitride layer to conform the titanium-nitride layer to the pattern in the photoresist layer;

removing the remaining photoresist layer using a non-oxidizing photoresist stripper;

depositing a dielectric layer on the titanium-nitride layer; and annealing the dielectric layer in an inert ambient having less than 3000 ppm oxygen.

17. The method of claim 16 wherein the step of depositing the photoresist layer comprises depositing a positive photoresist and the step of removing the photoresist layer using the non-oxidizing photoresist stripper comprises removing the photoresist layer using a stripper comprising n-methyl pyrrolidone having a basic pH, wherein the photoresist layer is removed in a first bath of n-methyl pyrrolidone maintained at a temperature of approximately 75° to 85° C. and removing residual photoresist in a second bath of n-methyl pyrrolidone maintained at approximately 45° to 55° C.

18. The method of claim 16 wherein the step of depositing the dielectric layer comprises:

depositing a silicon oxide layer using a plasma-enhanced source comprising TEOS.

* * * * *